US005884393A

United States Patent [19]

Miyazawa

[11] Patent Number: 5,884,393

[45] Date of Patent: Mar. 23, 1999

[54] MOUNTING JIG FOR ELECTRICAL CONNECTORS

[75] Inventor: Junichi Miyazawa, Yokohama, Japan

[73] Assignee: Molex Incorporated, Lisle, Ill.

[21] Appl. No.: 689,753

[22] Filed: Aug. 13, 1996

[30] Foreign Application Priority Data

Oct. 5, 1995 [JP] Japan .................................... 7-011583

[51] Int. Cl.$^{6}$ ...................................................... H05K 13/00

[52] U.S. Cl. .................................. 29/739; 29/759; 29/760

[58] Field of Search .............................. 29/757, 755, 739, 29/741, 759, 758, 832, 842, 760

[56] References Cited

U.S. PATENT DOCUMENTS

| | | | |
|---|---|---|---|
| 3,641,666 | 2/1972 | Scaminaci, Jr. et al. | 29/629 |
| 3,680,193 | 8/1972 | Scaminaci et al. . | |
| 4,394,795 | 7/1983 | Goss . | |
| 5,351,391 | 10/1994 | Doutrich et al. . | |

FOREIGN PATENT DOCUMENTS

| | | |
|---|---|---|
| 0042692 | 12/1981 | European Pat. Off. . |
| 0237728 | 9/1987 | European Pat. Off. . |
| 5135835 | 1/1993 | Japan . |

*Primary Examiner*—Carl E. Hall
*Attorney, Agent, or Firm*—Charles S. Cohen

[57] ABSTRACT

Connector mounting jigs for simultaneously positioning and mounting a plurality of electrical connectors on a printed circuit board include a base member, and at least two sets of pairs of synthetic resin posts extending from one surface of and formed integrally with the base member for frictional engagement of respective corners of a cavity of each connector to support respective connectors in a predetermined positional relationship to each other.

19 Claims, 3 Drawing Sheets

MOUNTING JIG FOR ELECTRICAL CONNECTORS

BACKGROUND OF THE INVENTION

The present invention relates generally to a jig for mounting a plurality of electrical connectors to be used for connecting a pair of printed circuit boards.

Conventionally, electrical connections between a first printed circuit board (motherboard) and another printed circuit board (daughterboard) may be established through the use of electrical connectors. In the past, one receptacle or female connector has been mounted on one printed circuit board, and an electrical plug or male connector is mounted on the other printed circuit board. By mating and connecting the female connector receptacle and the plug male connector with each other, electrical communication between the respective printed circuit boards is established. However, in the recent years, the number of required terminals or circuits is increasing due to the desire for down-sizing, reduction of weight of the electronic equipment and for higher performance. Accordingly, it now has become necessary on frequent occasions to mount a plurality of electrical connectors on each of the printed circuit boards.

When a plurality of electrical connectors are to be mounted on the surface of one of the printed circuit boards, it is important to be able to precisely position the respective connectors which are to be mounted to the same circuit board relative to each other. If they are not precisely positioned, the subsequent engagement between the electrical female connector receptacles and the electrical plug male connectors becomes difficult. Moreover, the solder tails of the respective connectors and the circuits on the circuit boards to which they are to be soldered might be misaligned to the extent that could result in the failure to complete circuits which should have been completed.

Various methods have been employed in the past to avoid such problems. One such prior method for positioning of the connectors is by setting a guide block which is designed to accommodate the connectors therein on the printed circuit board as is disclosed in Japanese Unexamined Patent Publication (Kokai) No. Heisei 5-47443. Another method connects two connectors by means of a bridge for fixing the relative portions of the connectors as is disclosed in 0.5 mm Pitch Multi-Pole Board-to-Board Connector, Electronics Mounting Technology, Vol. 10, No. 10, pp. 72–73.

Another known method is to restrict the relative positions of a plurality of connectors by employing a jig having cavities to externally engage with the connectors is disclosed in Japanese Unexamined Patent Publication No. 5-135835.

Among the prior art set forth above, the methods employing the guide block or the bridge have a problem of consuming spacial volume on the circuit board that might otherwise have a functional use because the guide block or the bridge is mounted on the printed circuit board together with the connectors. On the other hand, in the case of the aforementioned method employing the jig, because a part of the jig is located outside of the connector, a space to accommodate the extending part of the jig must be provided during the mounting of the connector on the printed circuit board. Therefore, similar to the former case, this method still causes the waste and loss of what otherwise could be functional volume or space on the circuit board.

SUMMARY OF THE INVENTION

In view of the aforementioned problems, it is an object of the present invention to provide a jig for mounting a connector which can mount a plurality of connectors on a printed circuit board with high positioning accuracy and without sacrificing functional volume or space.

In one principal aspect of the invention a plurality of electrical connectors are positioned for mounting on a printed circuit board by providing a jig having a perimeter and at least four posts spaced from each other and positioned adjacent the perimeter of the jig. One of the connectors is positioned over two of the spaced posts so that the two spaced posts extend into at least one cavity in one of the connectors and engage the cavity to position and hold the connector on the jig and substantially at the perimeter of the jig. Another of the connectors is positioned over the other two spaced posts so that the other two spaced posts extend into at least one cavity of that connector and engage the cavity to position and hold the last mentioned connector on the jig, substantially at the perimeter of the jig and in a fixed predetermined relationship to the first connector. Once the connectors are mounted to the printed circuit board, the jig and posts are removed from the connectors.

In another principal aspect of the invention, the posts frictionally engage the cavity of the connectors.

In still another principal aspect of the invention, the posts deform to frictionally engage the cavity.

In still another principal aspect of the invention, the jig includes at least two sets of posts. Each of the sets of posts includes two pair of posts with each pair and each post in each said set being spaced from each other. Each set of posts and each post in each set is also positioned to coincide and conform to the cavity of a connector, and the one of the connectors is positioned over one of the sets of posts, and the other of the connectors is positioned over the other of the sets of posts.

In still another principal aspect of the invention, each of the posts in the last mentioned pairs of posts is deformable both in the direction of the other posts of the pair and the other pair of posts in the set.

In still another principal aspect of the invention, the aforementioned fixed predetermined relationship between the connectors may be in side by side relationship.

In still another principal aspect of the invention, at least one additional connector may be positioned on the jig in end to end relationship to at least one of the aforementioned connectors.

In still another principal aspect of the invention, the connectors have a cavity within the connector and each of the pair of posts is spaced from each other by a distance substantially equal to the length of the cavity of one of the connectors and one post of each pair is spaced from the other post of each pair by a distance substantially equal to the width of the cavity.

In still another principal aspect of the invention, the aforementioned connectors have a perimeter, and the posts are positioned within the maximum dimensions of the perimeters of the connectors when the connectors are positioned on the posts.

These and other objects, features and advantages of the present invention will be more clearly understood through a consideration of the following detailed description.

BRIEF DESCRIPTION OF THE DRAWINGS

The present invention will be understood more fully from the detailed description given herebelow and from the accompanying drawings of the preferred embodiment of the invention which are for explanation and understanding of the invention only and not limiting thereof, and in which.

DESCRIPTION OF THE PREFERRED EMBODIMENTS

The present invention will be discussed hereinafter in detail in terms of the preferred embodiments and with reference to the accompanying drawings.

Figure 1:
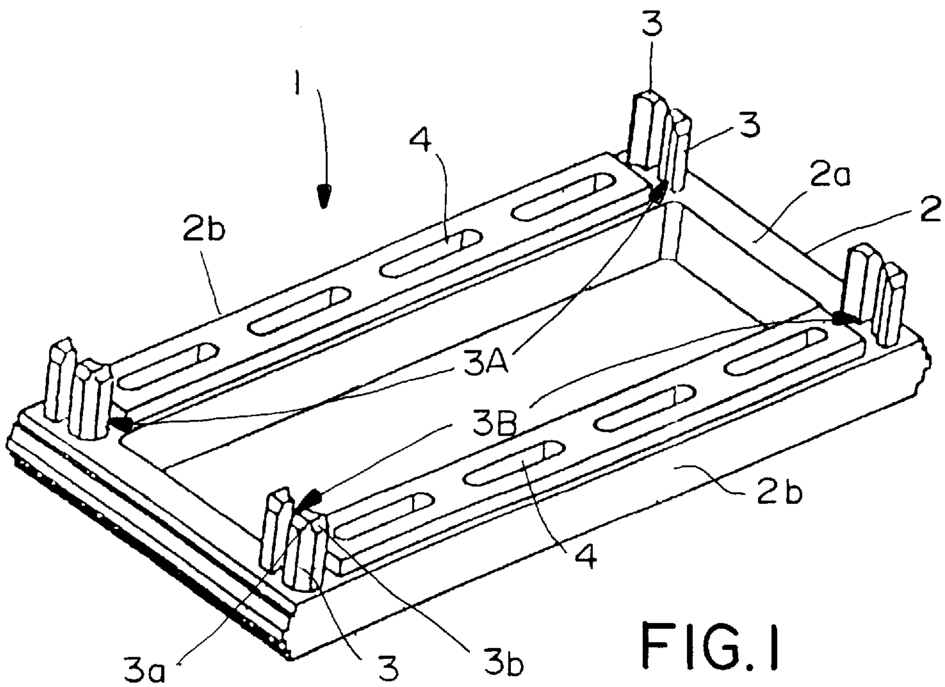
FIG. 1 is a perspective view of a first embodiment of a connector mounting jig constructed according to the principles of the present invention.

A first embodiment of a connector mounting jig 1 according to the present invention is shown in FIG. 1. The connector mounting jig 1 has a base member 2 of generally polygonal shape, and more preferably of rectangular shape as seen in FIG. 1. The base member 2 is generally formed of shorter transversely extending pieces 2*a* and longer longitudinally extending side pieces 2*b*. Two pairs of posts 3 preferably extend upwardly from the upper (as shown in the drawings) surface at each end of the longer pieces 2*b* and at each corner of the base member 2 adjacent its perimeter to define two sets of pairs of posts 3A and 3B, as shown in FIG. 1, one set for each connector. The base member 2 and the posts 3 are preferably formed integrally with each other and of the same synthetic resin material. Through openings 4 also are preferably formed at given intervals as shown in FIG. 1 in the longer pieces 2*b*. Accordingly, if the frame of the base member 2 is formed of hollow construction, and the through openings 4 are formed through the longer pieces 2*b*, the base member 2 can be made light in weight. In addition, the openings reduce the shrinkage of the plastic base member which could affect the position of posts 3.

Figure 2:
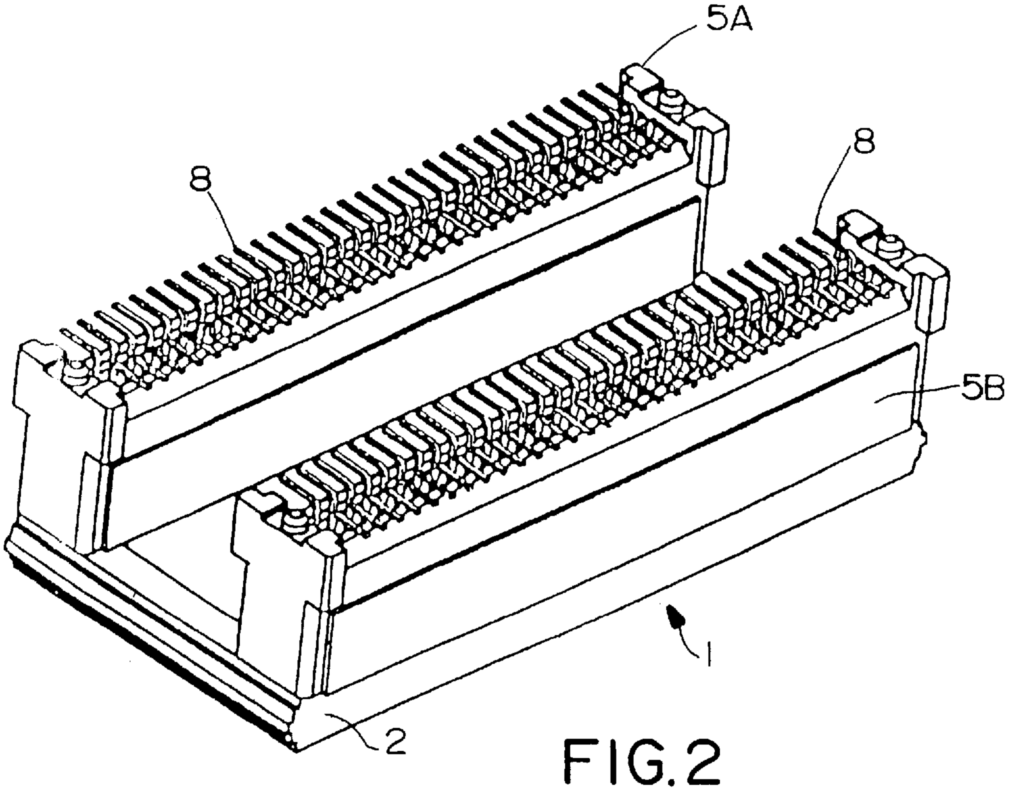
FIG. 2 is a perspective view of the first embodiment of the connector mounting jig in use to position a plurality of connectors for mounting to a circuit board.
Figure 3:
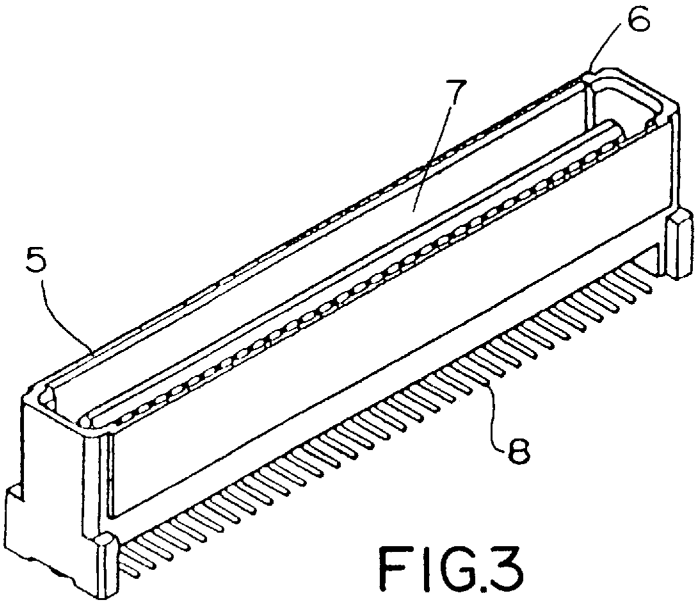
FIG. 3 is a perspective view of a connector to be mounted by the first embodiment of connector mounting jig, and in which the connector is illustrated in an upright condition.
Figure 4:
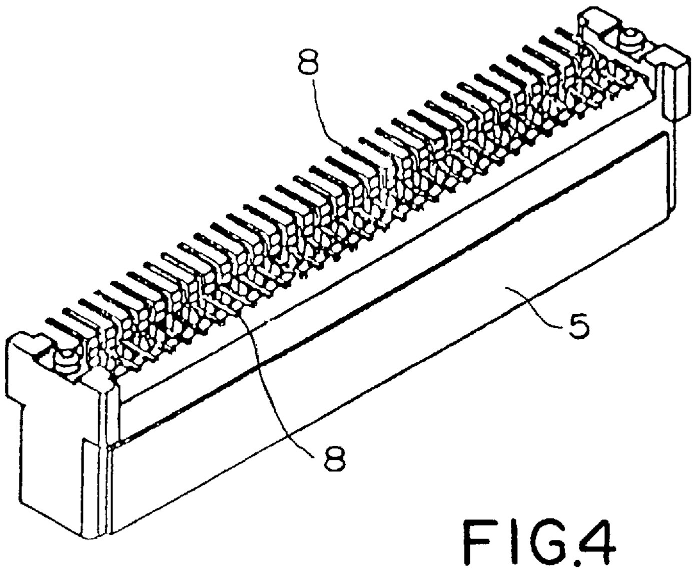
FIG. 4 is a perspective view of the connector substantially as shown in FIG. 3 to be mounted by the first embodiment of the connector mounting jig, but in which the connector is in the upside down condition.

Each set of pairs of posts 3A and 3B is adapted to correspond with each of two connector components 5A and 5B, respectively, as shown in FIG. 2. Each connector 5 is illustrated in FIGS. 3 and 4. The posts 3 at the opposite ends of one longer piece 2*b* are adapted to be inserted in and engaged with a cavity in each connector component, such as internal cavity 7, and the posts are preferably formed and shaped to mate with mating surfaces in each connector such as mating surfaces 6, as viewed in FIG. 3. As shown in FIG. 1, two pair of posts, one at each end of a longer piece 2*b* of the base member 2 are preferably provided and each of the two sets 3A and 3B are engaged with each of the connectors 5A and 5B, respectively.

In order to insert the two pairs of posts 3 of a set of posts 3A or 3B into the receptacle cavity 7 while establishing frictional engagement with the peripheral surface of the receptacle cavity, and to release the posts from the receptacle cavity 7, each post 3 is preferably deformable both in the longitudinal direction of the longer piece 2*b* and in the direction perpendicular thereto, i.e., in the transverse direction perpendicular to the longitudinal direction of the connector 5. Each of the posts 3 is also preferably chamfered at their tips at 3*a* and 3*b* as shown in FIG. 1 to facilitate insertion of the posts 3 into the receptacle cavity 7.

FIG. 2 illustrates a condition where two connector components 5A and 5B are to be mounted on the printed circuit board by means of the first embodiment of the connector mounting jig 1 according to the invention. Each of two pairs of posts 3 at the respective opposite ends of the longer piece 2*b* of the base member 2, i.e., a set of posts 3A or 3B, are inserted into and engaged with the receptacle cavity 7 of the corresponding connector component 5. By maintaining this condition, two connector components 5A and 5B mounted on both longer pieces 2*b* of the base member 2 can be maintained at a fixed positional relationship in both the longitudinal and lateral directions. Therefore, by soldering the two connector components 5A and 5B on the printed circuit board while maintaining fixed positional relationship between the two connector components 5A and 5B, the relative positions of the two connector components on the printed circuit board 2 can be fixed with certainty and accuracy by the posts 3 of the connector mounting jig 1. As a result, two connector components 5A and 5B can be mounted on the printed circuit board with high precision.

While the connector component 5 shown in FIGS. 2–4 of the drawings is provided with the solder tails 8 adapted to be mounted on the surface of the printed circuit board by way of soldering, the connector mounting jig 1 according to the present invention is equally effective for mounting connectors of the type having solder tails that pass through holes formed in the printed circuit board.

After completion of mounting of the connector components 5A and 5B onto the printed circuit board, the connector mounting jig 1 is simply removed by removing and releasing the posts 3 from the receptacle cavities 7 by pulling the jig 1 away from connector components 5A and 5B. Accordingly, after the connector components 5A and 5B are mounted, the connector mounting jig 1 is no longer necessary and may be completely removed from the connector-printed circuit board assembly. Therefore, waste or loss of what otherwise might be functional space or volume is eliminated.

Furthermore, during mounting, no part of the connector mounting jig 1 extends beyond the extreme circumferential surfaces of the connector components 5, again avoiding the sacrifice or waste of mounting space or volume on the printed circuit board that might otherwise have a functional use. The distance between two pairs of the posts 3 at the same ends of the longer pieces 2*b*, i.e., two pairs of posts of the respective sets 3A or 3B, at all times corresponds to the desired distance between the respective connector components 5A and 5B. Therefore, either where the two connector components 5A and 5B are to be arranged as close as possible to each other or where the two connector components 5A and 5B are to be arranged at some predetermined distance, either spacing can be accurately maintained by the transverse distance between the two sets 3A and 3B of pairs of respective posts.

Figure 5:
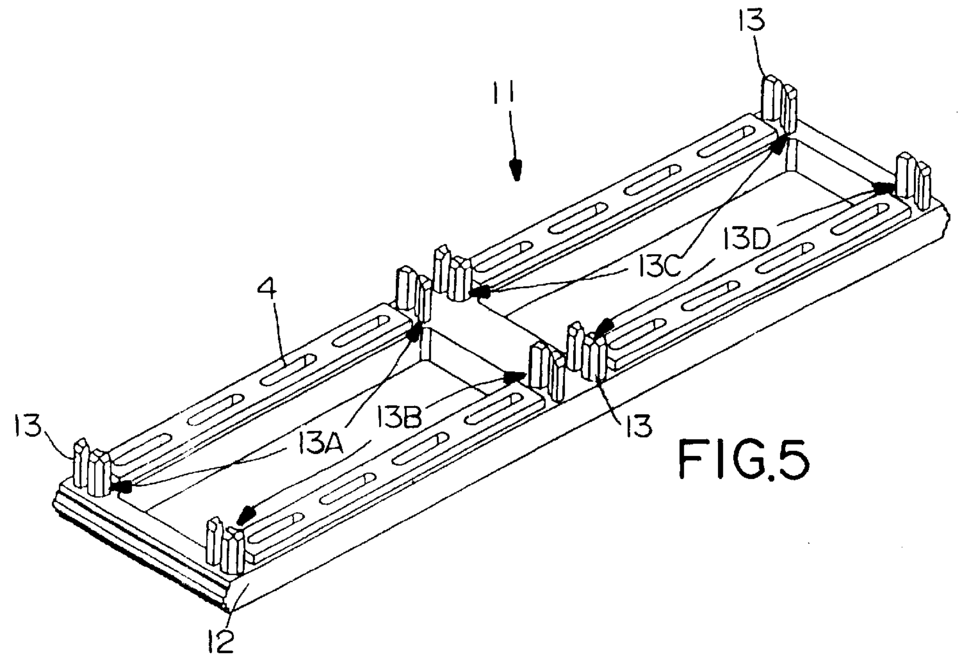
FIG. 5 is a perspective view of a second embodiment of the connector mounting jig constructed according to the principles of the invention.
Figure 6:
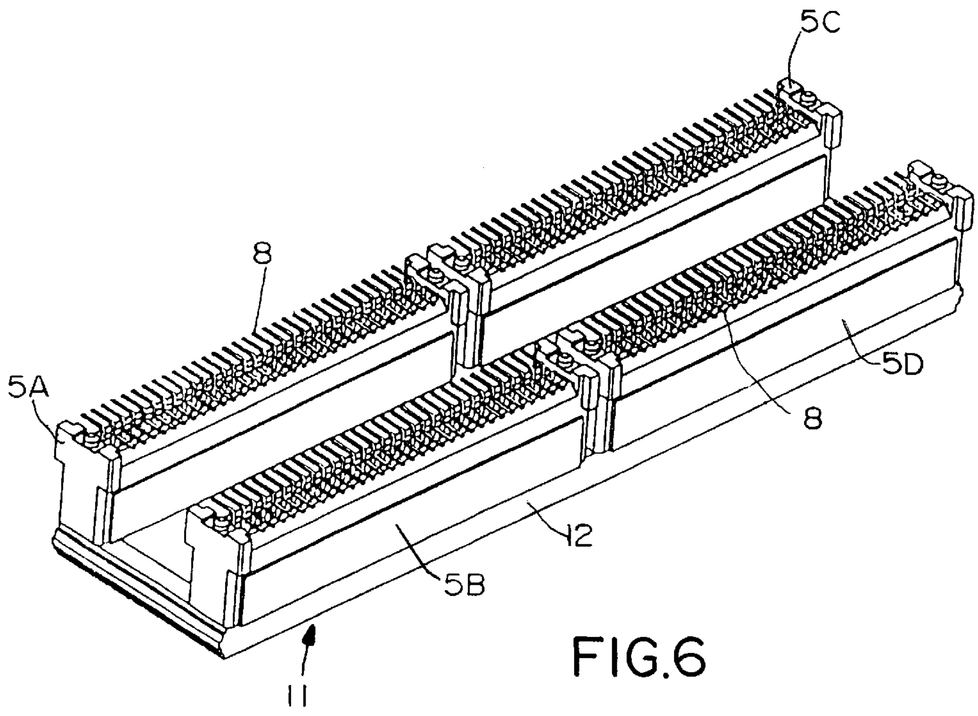
FIG. 6 is a perspective view of the second embodiment of the connector mounting jig in use to position a plurality of connectors for mounting to a circuit board.

A second embodiment of connector mounting jig 11 according to the present invention is shown in FIGS. 5 and 6. In this embodiment two base members 2 of the first embodiment are connected in tandem fashion so that four connector components 5A, 5B, 5C and 5D (either receptacle or plug connector components), as seen in FIG. 6, may be mounted simultaneously on a printed circuit board. The base member 12 of this embodiment is provided with eight pairs of posts 13 at respective corners, and also at the intermediate position to form four sets of posts 13A, 13B, 13C and 13D, as seen in FIG. 5. Similar to the first embodiment, the base member 12 and the posts 13 are preferably formed integrally with each other and of the same synthetic resin material.

In FIG. 6 the connector mounting jig 11 is shown in use. As seen in FIG. 6, four connector components 5A–5D are arranged in two parallel strings. Similar to the first embodiment, the positional relationship between the connector components 5A–5D can be fixed and maintained with accuracy and certainty. Therefore, the four connector components 5A–5D can be accurately mounted on a printed circuit board with precise positional relationship relative to each other. As in the first embodiment, the pairs of posts 13 are respectively inserted in and engaged into the respective corners of the connector components 5, and can be released therefrom after completion of mounting of the connectors 5A–5D onto the printed circuit board. By releasing the posts 13 from engagement with receptacle cavities 7 of the connector components, the connector mounting jig 11 can be removed.

It will be understood that while the two embodiments described herein are discussed in terms of mounting two or four connector components, the number of the connector components is not limited to the specific number described, but can be of any desired number, such as three, five, six, etc. In any case, the number of post sets to be provided on the base member may simply be adapted to the desired number of the connector components to be mounted. Additionally, it will be understood that although the embodiments discussed herein are illustrated using receptacle connector components which receive the mounting posts 3, 13 within an internal cavity within the sidewalls of the connector components, the posts may be received within similar internal cavities of male or plug connector components as well as external cavities of the connector component sidewalls. Moreover, it will also be understood that although some of the connector components 5 are shown in FIG. 6 in end to end relationship, they may also be arranged in side by side relationship, and while some are shown in side by side relationship in FIG. 2, they may also be arranged in end to end relationship.

It will also be understood that the preferred embodiments of the present invention which have been described are merely illustrative of the principles of the present invention. Modifications may be made by those skilled in the art without departing from the true spirit and scope of the invention.

I claim:

1. A connector mounting jig for simultaneously positioning a plurality of electrical connector components in a predetermined arrangement for subsequent mounting on a printed circuit board, each of the connector components having a body portion and at least one cavity extending within the connector component body portion, each said cavity having a predetermined width, each of said cavities having a predetermined width and each of said connector components having a predetermined exterior periphery, the connector mounting jig comprising:

a base member having an upper surface and a perimeter;

at least two sets of resilient posts extending upward from said upper surface of said base member adjacent its perimeter, one of said sets of resilient posts being positioned in a predetermined relationship to the other set of posts on said base member, and each of said sets of posts comprising at least two pair of posts with each of said pair of posts and each post being spaced from each other, each set of posts and each post in each set being positioned to coincide and conform with a corresponding cavity of one of said connector components, so that each of said sets of posts may be inserted in and engage the cavity of one of said connector components, each set of posts frictionally engaging surfaces of said connector component cavity, to thereby firmly position and support the respective connector components on said base member in said predetermined relationship, said base member having a preset perimeter and said sets of resilient posts being disposed on said base portion in an arrangement such that, when said connector components are mounted to said base member, no portion of said base member of said mounting jig extends past said exterior peripheries of said connector components.

2. The connector mounting jig of claim 1, wherein said base member is formed of a synthetic resin, and said posts and said base are formed integrally with each other.

3. The connector mounting jig of claim 1, wherein said base member is of a polygonal frame-shaped configuration.

4. The connector mounting jig of claim 3, wherein said configuration is rectangular.

5. The connector mounting jig of claim 1, wherein said posts are arranged for supporting at least two of said connectors in a fixed positional side by side relationship to each other.

6. The connector mounting jig of claim 5, wherein said posts are also arranged for supporting at least two additional connector components in fixed positional end to end relationship to said side by side connectors.

7. The connector mounting jig of claim 1, wherein said posts are arranged for supporting at least two of said connectors in fixed positional end to end relationship to each other.

8. The connector mounting jig of claim 1, wherein each resilient post is deformable in the directions of both the other pair of posts on the set and the other post in each pair.

9. The connector mounting jig of claim 1, wherein said base member comprises:

a frame having elongate frame components oriented in a given direction for arranging and positioning said connector components relative to each other, at least some of said frame components having openings disposed therein between distinct sets of said posts for lightening the jig.

10. The connector mounting jig of claim 1, wherein each cavity of said connector components includes a length and width entirely contained within said connector component body portion, and each of said pair of posts in a distinct set of said posts is spaced from each other by a distance substantially equal to the length of said connector component cavity, and one post of each said pair is spaced from the other post of each said pair of posts by a distance substantially equal to the width of said connector component cavity to thereby facilitate said frictional engagement of said connector component cavity by said sets of posts.

11. The connector mounting jig of claim 1, wherein the connector components have a perimeter having maximum dimensions, and said posts are positioned relative to each other to be within the maximum dimensions of the perimeter of the connector components when the connector components are positioned on the posts.

12. A combination comprising:

a plurality of electrical connectors, each of the connectors having a plastic body portion that defines, in part, an exterior periphery of said connector, each connector further including a plurality of spaced apart conductive terminals arranged along said sidewalls said conductive terminals extending out from said connector body portion into an arrangement for surface mounting said connector to a printed circuit board; and, a connector mounting jig for supporting said connectors in a predetermined pattern for surface mounting of said connectors to a printed circuit board, including:

a base member having an upper surface and a perimeter; and at least two distinct sets of posts extending upward from said upper surface of said base member, one of said distinct sets of posts being positioned in a predetermined relationship to the other distinct set of posts, and each of said distinct sets of posts comprising at least two pair of posts with each of said pair of posts and each post being spaced from each other, each set of posts and each post in each set being positioned apart a preselected distance from each other so that each of said distinct sets of posts frictionally engage said connector cavities when inserted in said connector cavities to thereby firmly position and support the respective connectors on said base member in a predetermined relationship to each other, said distinct sets of posts being disposed on said base member near said perimeter thereof whereby, when said connectors are supported on said connector mounting jig, no portion of said base member perimeter extends outwardly past said exterior peripheries of said connectors.

13. The combination of claim 12, wherein said base member is formed of a synthetic resin, and said posts and said base member are formed integrally with each other.

14. The connector of claim 12, wherein said base member is rectangular.

15. The combination of claim 12, wherein said posts support at least two of said connectors in a fixed positional side-by-side relationship to each other.

16. The combination of claim 15, wherein said posts support at least two of said connectors in fixed positional end to end relationship to said side-by-side connectors.

17. The combination of claim 12, wherein said posts support at least two of said connectors in fixed positional end to end relationship to each other.

18. The combination of claim 12, wherein said posts are positioned on said base member and closely adjacent said base member perimeter.

19. A connector mounting jig for simultaneously positioning a plurality of electrical connector components in a predetermined arrangement for mounting onto a printed circuit board in a predetermined mounting area of the printed circuit board, said printed circuit board having a plurality of components arranged around said predetermined mounting area, each of the connector components having a body portion defining an exterior periphery of said connector component, and each of said connector components having at least one opening formed in said body portion thereof, the connector mounting jig comprising:

a base member having a predetermined perimeter;

a plurality of distinct sets of posts disposed on said base member adjacent said base member perimeter and extending upwardly from said base member, each distinct set of posts including at least two pair of posts, with each of said pair of posts and each post being spaced from each other, each pair of posts and each post in each said pair being positioned to coincide and conform with a corresponding opening of one of said connector components, so that each of said sets of posts may be inserted into said cavity of one of said connector components to engage opposite surfaces of said connector component cavity, to thereby firmly position and support the respective connector components on said base member in said predetermined relationship, said sets of posts being disposed on said base portion such that when said connector components are mounted to said base member, no portion of said base member extends past said exterior peripheries of said connector components.

* * * * *